(12) United States Patent
Mizuno et al.

(10) Patent No.: US 6,637,004 B1
(45) Date of Patent: Oct. 21, 2003

(54) ERROR CORRECTION CIRCUIT AND METHOD

(75) Inventors: Takanori Mizuno, Tokyo (JP); Yoshiteru Imaeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/487,795

(22) Filed: Jan. 20, 2000

(30) Foreign Application Priority Data

Jan. 21, 1999 (JP) ............................................ 11/012771

(51) Int. Cl.[7] ............................................. H03M 13/03
(52) U.S. Cl. ........................ 714/796; 714/794; 714/795
(58) Field of Search ................................ 714/794, 795, 714/796

(56) References Cited

U.S. PATENT DOCUMENTS

| | | | | |
|---|---|---|---|---|
| 4,802,174 A | | 1/1989 | Hiraiwa et al. | |
| 5,295,142 A | * | 3/1994 | Hatakeyama | 714/794 |
| 5,398,254 A | * | 3/1995 | Miya et al. | 714/795 |
| 5,414,738 A | * | 5/1995 | Bienz | 375/341 |
| 5,418,795 A | | 5/1995 | Itakura et al. | |
| 5,440,572 A | * | 8/1995 | Kitaori | 714/794 |
| 5,509,021 A | * | 4/1996 | Todoroki | 714/795 |
| 5,602,858 A | * | 2/1997 | Kitaori | 714/795 |
| 5,796,693 A | * | 8/1998 | Taguchi et al. | 369/59.22 |
| 5,809,044 A | * | 9/1998 | Todoroki | 714/786 |
| 5,838,697 A | * | 11/1998 | Abe | 714/796 |
| 5,844,946 A | * | 12/1998 | Nagayasu | 375/341 |
| 5,878,092 A | * | 3/1999 | Choi | 375/341 |
| 6,148,431 A | * | 11/2000 | Lee et al. | 714/794 |

\* cited by examiner

Primary Examiner—Phung M. Chung
Assistant Examiner—Joseph P. Torres
(74) Attorney, Agent, or Firm—Whitham, Curtis & Christofferson, PC

(57) ABSTRACT

A circuit 202 for executing range shift-up/-down of pass metric values is provided as an additional circuit preceding to an ACS circuit 203 for adding and comparing branch metric computation values and preceding pass metric values and selecting the highest likelihood pass. It is thus possible to permit effective use of RAM bits by executing range shift-up and the accuracy of the effective bits of input data when it is necessary to expand the effective bits of the pass metric values, while executing range shift-down and increasing the accuracy of the input data when the effective bits of the pass metric values are not fully used.

16 Claims, 7 Drawing Sheets

FIG. 4
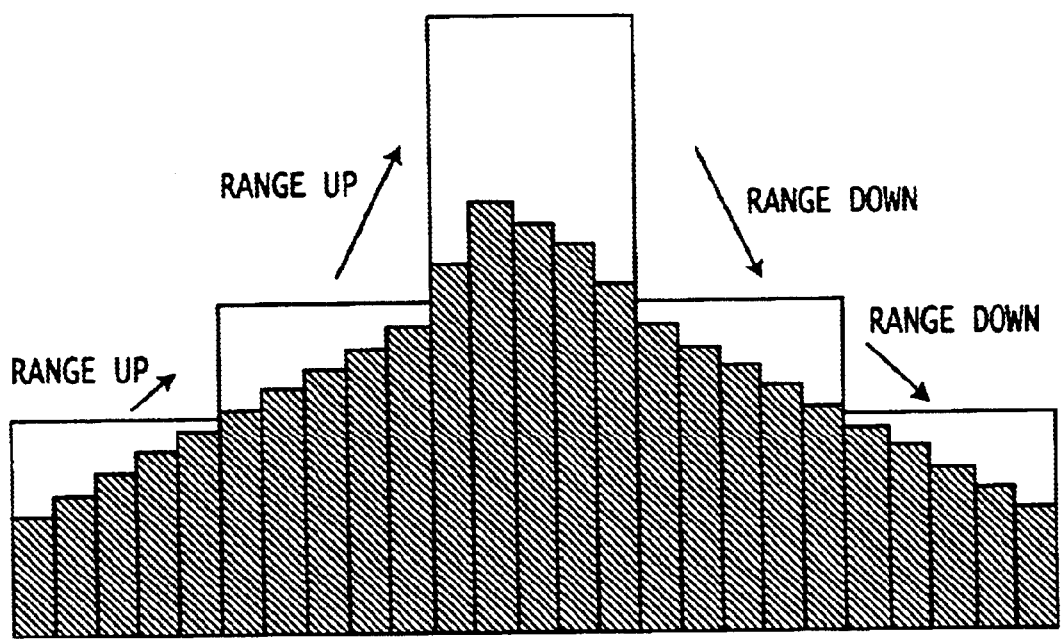
 : RANGE
 : (PREVIOUS MAXIMUM PATH METRIC VALUE − PREVIOUS MINIMUM PATH METRIC VALUE) + MAXIMUM BRANCH METRIC VALUE

ERROR CORRECTION CIRCUIT AND METHOD

BACKGROUND OF THE INVENTION

The present invention relates to error correction circuits and method, and more particularly, to an error correction circuit and method for path metric computing system adopting a Viterbi decoding system.

Path metric computing systems are well known as disclosed in, for instance, "Metric Computation System" in Japanese Patent Laid-Open No. 62-77717 and "Viterbi decoder" in Japanese Patent Laid Open No. 6-164423.

In such prior art path metric computing systems, usually either an ACS (Add Compare Select) circuit or a branch metric value computing circuit computes each path metric value by subtracting the minimum path metric value from the preceding path metric value for preventing the overflow off the path metric memory.

FIG. 8 is block diagram showing a prior art error correction circuit. In this circuit, an ACS circuit 103 receives the outputs of a branch metric value computing circuit 101 and a minimum path metric value subtracting circuit 102, and feeds its output to a path memory. The output of the ACS circuit 103 is also fed back via a path metric memory 105 to the minimum path metric value subtracting circuit 102 and also fed back via a minimum 25 path metric value detecting circuit 104 to the circuit 102.

The above prior art error correction circuit has some points to be improved. A first point is that the path metric memory bits are not effectively utilized due to the following ground. Usually, the bit length, of the path metric memory that is used is the sum of the input data bit length and a number of bits corresponding to the maximum inter-code distance. Actually, however, where C/N is bad, the bit length is not effectively used. Where C/N is good, the path metric memory bit length is effectively used so long as it has an adequate value although some difference arises depending on the restriction length. Where C/N is good, the path metric assumes a maximum value in its range with an effective path, while is assumes a minimum value with an ineffective path. This means that effective use of the bit length in obtainable in this case even by carrying our, as a measure against over-flow, a path metric value computation "Preceding path metric value−Minimum path metric value=New path metric value". Where C/N is bad, however, the effective and ineffective path metric values are closely spaced apart, and therefore the computed new path metric value is small. For this ground, the path metric memory bit length can no longer be, effectively used.

A second point in the prior art circuit is that increasing the number of input data judgment bits in an error correction circuit based on the Viterbi algorithm, extremely increases the size of the memory, which is necessary for tentatively storing path metric values. This is so because it is necessary to store (ZN−1) path metric values where Z is the number of possible states and N is the restriction length. By way of a specific example, where the restriction length is 9, the state number Z is $2^{9-1}=256$. This means that increasing the effective accuracy by one bit requires an additive memory capacity of 256 bits.

SUMMARY OF THE INVENTION

An object of the present, invention, therefore, is to provide an error correction circuit and method capable of reducing its scale and simplifying its construction by reducing the capacity of the memory necessary for tentatively storing path metric values.

According to an aspect of the present invention, there is provided an error correction circuit based on a Viterbi decoding system comprising a branch metric computing circuit, an ACS circuit and a path metric memory, wherein: the error correction circuit comprises subtracting circuit with range shift disposed between the branch metric computing circuit and the ACS circuit; the output of the ACS circuit being fed our via a detector to the subtracting circuit with range shift.

The subtracting, circuit with range shift includes a subtracting circuit of a minimum path metric value from a path metric value and a first and a second range shifters.

The detector includes a maximum/minimum path metric value detecting circuit having a maximum and a minimum path metric value register, a range comparing circuit and a reversible counter.

The branch metric computing circuit includes a plurality of adders, and the ACS circuit includes ACS sub-circuits corresponding to the adders, respectively, whereby a parallel processing of a plurality of paths is executed.

According to another aspect of the present invention, there is provided an error correction circuit adopting a Viterbi decoding system, wherein preceding to a computing means for adding branch metric values and path metric values are provided a means for updating the dynamic ranges of the branch and path metric values, a means for executing a check, from all the new path metric values, as to whether it is necessary to update the dynamic ranges, n the next ACS process and holding the result of the check, during the next ACS process.

According to other aspect of the present invention, there is provided an error correction circuit comprising: a branch metric value computing circuit for computing branch metric value from received data; a subtracting circuit with range shift receiving range shift signal, and executes range shift of the path and branch metric value ranges in which the minimum path metric value has been subtracted, for subtracting the previously detected minimum path metric value from the immediately preceding path metric value; an ACS circuit for executing addition and comparison of the preceding p:ass metric values and branch metric values, and selecting the maximum path metric value to provide the selected new path metric value and a path selection signal; a detector for detecting the maximum and minimum path metric values in an ACS process for one-bit data, and also for detecting the range shift value to provide a range shift signal to the subtracting circuit with range shift; and a path metric memory (memory means) for holding the computed path metric values.

The subtracting circuit with range shift includes a subtracting circuit for subtracting a preceding minimum path metric value from the preceding path metric value; a range shifter for contracting the input data to one half in response to the reception of the down signal while expanding the input data to double thereof in response to the reception of the up signal to feed out the resultant data to the ACS circuit; and a range shifter for multiplying the branch metric value by 2S or (½)S, where S is a shift constant, and feeding out the resultant product value to the ACS circuit.

The subtracting circuit with range shift includes: a detector for detecting the maximum and minimum path values among the new path metric values which have been obtained in an ACS process for one bit of decoded data; a range comparing circuit for generating a range shift-up signal when ((previous maximum path metric value–previous minimum path metric value)+maximum branch metric value) becomes greater than the maximum value that can be stored in the memory, and a range shift-down signal when ((previous maximum path metric value–previous minimum path metric value)×2+maximum branch metric value) becomes less than the maximum value that can be stored in the memory; shift signal register for latching the shift-up or shift-down signal, and holding the latched signal during the next process for one decoded data bit. When the ACS process for one decoded data is ended; and a reversible counter for detecting the shift-up or shift-down signal, and executing one count-up (+1) or -down (–1), and during the nest ACS process for one decoded data bit when the ACS process for one decoded data bit is ended.

According to further aspect of the present invention, thee is provided an error correction method comprising steps of: computing branch metric value from received data; receiving a range shift-up (or -down) signal, and executing range shift-up (or -down) of the path and branch metric value ranges, in which the minimum path metric range has been subtracted, for subtracting the previously detected minimum path metric value from the immediately preceding path metric value; executing addition and comparison of the preceding path metric values and branch metric values, and selecting the maximum path metric value to provide the selected new path metric value and a path selection signal; detecting the maximum and minimum path metric values in an ACS process for one-bit data, and also executing range shift-up (or down) judgment to provide a range shift-up (-down) signal, and the minimum path metric value to the subtracting circuit with range shift; and holding the computed path metric values.

Other objects and features will be clarified from the following description with reference to attached drawings.

BRIEF DESCRIPTION OF THE DRAWINGS

FIG. 4 is a diagram showing the range shift-up/-down operation of the error correction circuit according to the present invention;

PREFERRED EMBODIMENTS OF THE INVENTION

Preferred embodiments of the present invention will now be described with reference to the drawings.

Figure 1:
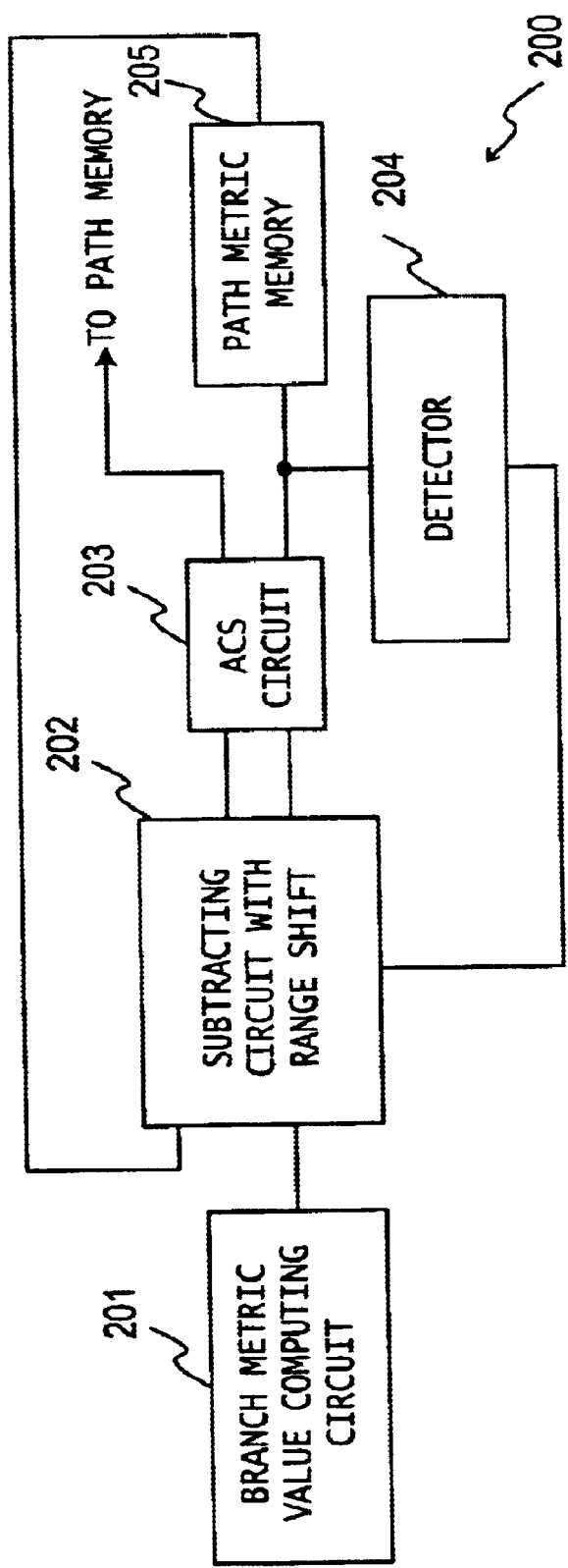
FIG. 1 is a block diagram showing a preferred embodiment of the error correction circuit according to the present invention.

FIG. 1 is a block diagram showing a preferred embodiment of the error correction circuit according to the present invention. The error correction circuit 200 comprises a branch metric value computing circuit 201, a subtracting circuit with range shift 202, an ACS circuit 203, a detector 204 and a path metric memory 205.

The branch metric value computing circuit 201 computes the branch metric from received data. The subtracting circuit with range shift 202 subtracts the previously detected minimum path metric value from the immediately preceding path metric value. Also, the circuit 202 receives a range shift-up (or -down) signal, and executes range shift-up (or -down) of the path and branch metric value ranges, in which the minimum path metric value has been subtracted. The ACS circuit 203 executes addition and comparison of the preceding path metric values and branch metric values, and selects the maximum path metric value. The circuit 203 thus feeds out the selected new path metric, value and a path selection signal.

The detector 204 detects the maximum and minimum path metric values in an ACS process for one-bit data, and also executes range shift-up (or -down) judgment. The circuit 204 thus feeds out a range shift-up (-down) signal and the shift constant to the subtracting circuit with range shift 202. The path metric memory (memory means) 205 holds the computed path metric values.

One feature of the error correction circuit 200 according to the present inventionas shown in FIG. 1, resides in that, in lieu of the prior art subtracting circuit having the sole function of the minimum path metric value subtraction, the subtracting circuit with range shift 202 is used, which has the additional function of range shift- up-/down-shifting.

Another feature of the error correction circuit 200 according to the present invention, resides in that the detector 204, which has the additional function of feeding out a range shift-up/-down signal by detecting the range shift-up -down as well as the maximum path metric value, is provided in lieu of the minimum path metric value detecting circuit in the prior art, which has the sole function of new minimum path metric value detection.

Figure 2:
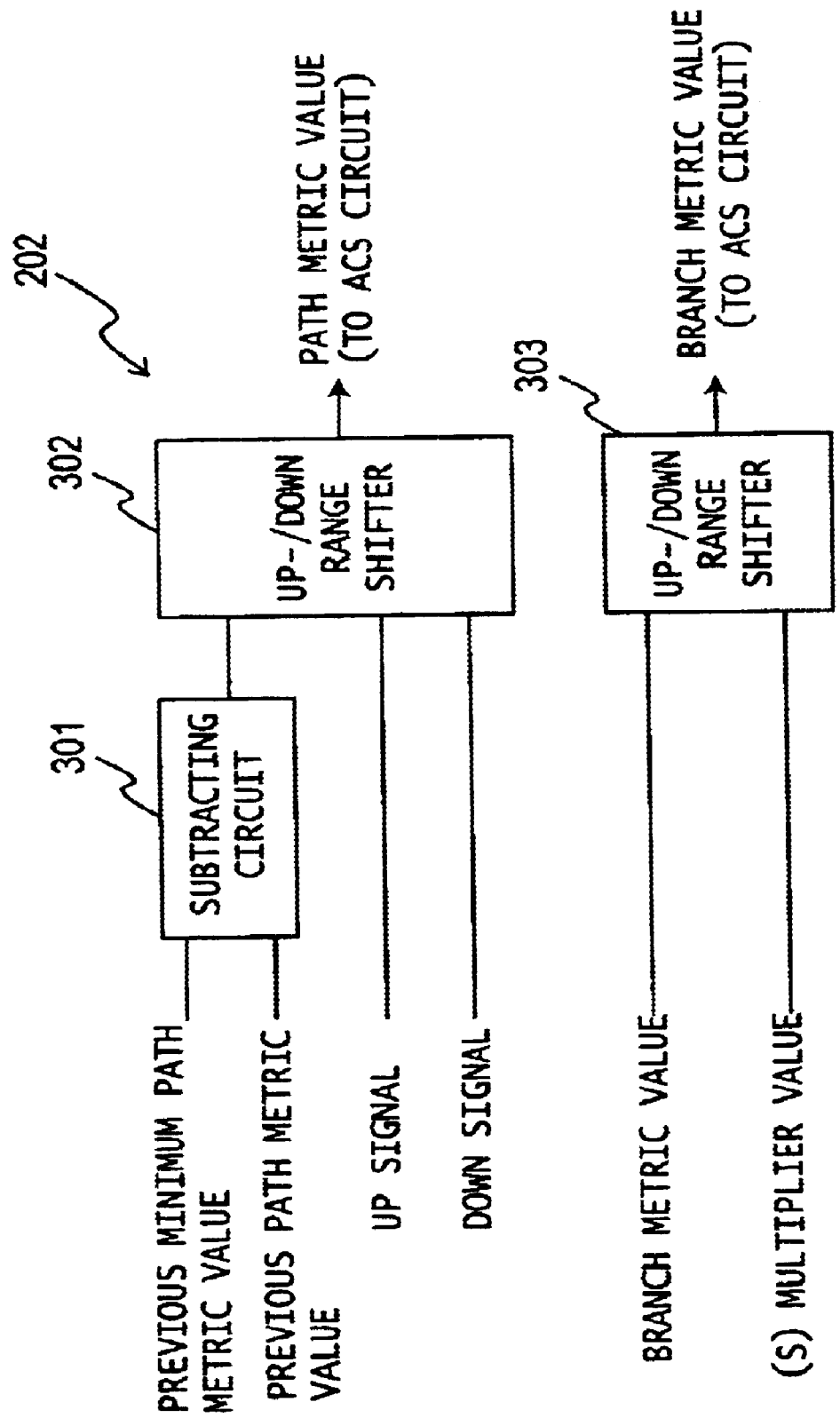
FIG. 2 is a detailed block diagram showing the subtracting circuit with range shift 202 in the error correction circuit shown in FIG. 1.

FIG. 2 is a detailed block diagram showing the subtracting circuit with range shift 202 in the error correction circuit shown in FIG. 1. The circuit 202 includes subtracting circuit 301, up-/down-range shifters 302 and 303. The subtracting circuit 301 subtracts the preceding minimum path metric value from the preceding path metric value. The range shifter 302 contracts the input data to one half in response to the reception of a down signal while expanding the input data to double thereof in response to the reception of an up signal, and feeds out the resultant data to the ACS circuit (203). The range shifter 303 multiplies the branch metric value by 2S or (½)S, where S is a shift constant, and feeds out the resultant product value to the ACS circuit 203.

Figure 3:
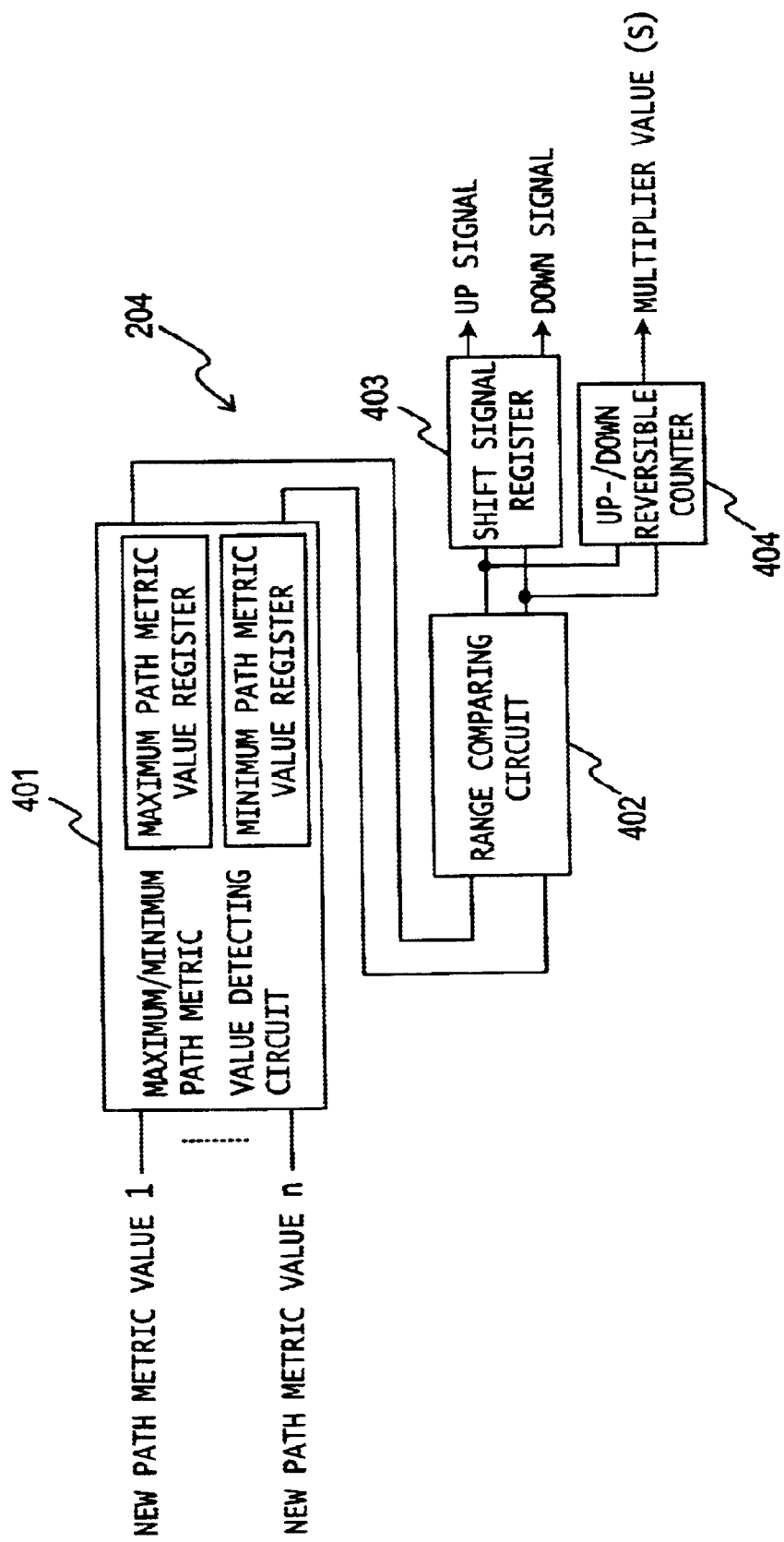
FIG. 3 is, a block diagram showing the detector 204 in the error correction circuit 200 shown in FIG. 1.

FIG. 3 is a block diagram showing the detector 204 in the error correction circuit 200 shown in FIG. 1. The circuit 204 includes a maximum/minimum path metric value detecting circuit 401, a range comparing circuit 402, a shift signal register 403 and a reversible counter 404.

The maximum/minimum path metric value detecting circuit 401 detects the maximum and minimum path metric values among the new path metric values which have been obtained in an ACS process for one bit of decoded data. The detected maximum and minimum path metric values are stored in a maximum and a minimum path metric value register, respectively. The maximum and minimum path metric values detected in the maximum/minimum path metric value detecting circuit 401 are both fed out to the range comparing circuit 402 for range shift-up/-down detection therein.

When ((previous maximum path metric value–previous minimum path metric value)+maximum branch metric value) becomes greater than the maximum value that can be stored in the memory, the range comparing circuit 402 feeds out a range shift-up signal to the shift signal register 403 and also to the reversible counter 404.

When ((previous maximum path metric value−previous minimum path metric value)×2+maximum branch metric value) becomes less than the maximum value that can be stored in the memory, the circuit 402 feeds out a range shift-down signal to the shift signal register 403 and also to the reversible counter 404. The maximum branch metric value is obtained as a result of shift-up/-down of the maximum one of the branch metric values fed out from the branch metric value computing circuit 201 according to the shift constant S.

When the ACS process for one decoded data is ended, the shift signal register 403 latches the shift-up or -down signal, and holds the latched signal during the next process for one decoded data bit. Also, when the ACS process for one decoded data bit is ended, the reversible counter 404 detects the shift-up or -down signal, and executes one count-up (+1) or -down (−1) and during the next ACS process for one decoded data bit it feeds out the product of the count value and the shift constant S.

Now, the operation of the error correction circuit 200 according to the present invention will now be described with reference to FIGS. 1 to 3. When the reception data is inputted, the branch metric computing circuit 201 computes branch metric values according to a generation polynomial formula. The branch metric values computed in the branch metric value computing circuit 201 are each fed out together with the preceding path metric value to the subtracting circuit with range shift 202. The subtracting circuit with range shift 202 computes (preceding path metric value−previous minimum path metric value) in each ACS process.

The circuit 202 also executes range shift-up (or -down) of the path metric values according to the up (or down) signal from the detector 204, and shifts the branch metric values according to the shift constant S. Thus, the new path metric values computed in the ACS circuit 203 are ranged up or down.

The range shift-up operation will be described. When ((previous maximum path metric value−previous minimum value)+branch metric value) becomes larger than the maximum value that can be stored in the path metric memory 205, the detector 204 feeds out an up signal and (shift constant+1).

As a result, a range shift-up operation is executed. Specifically, as shown in FIG. 4, after the subtraction the path metric values are shifted by one bit, and their range is expanded to double thereof. On the other hand, the branch metric values are contracted to one half, and their effective bits are reduced by one bit. In this state, subsequent ACS processes are executed. When an up signal is fed out again, the path metric values are further shifted by one bit, and their range is further expanded to double thereof, while the effective bits of the branch metric values are further reduced by one bit. It is to be noted that the branch metric values are shifted according to the shift constant S even when no up (or down) signal is fed out.

The range shift-down operation will now be described. When ( (previous maximum path metric value previous minimum path metric value)×2+maximum branch metric value) becomes less than the maximum value that can be stored in the path metric memory 205, the detector 204 feeds out a down signal, and also provides (shift constant S−1).

As a result, a range shift-down operation is executed. Specifically, as shown in FIG. 4, after the subtraction the path metric values are shifted by one bit in the direction opposite to the direction in the range shift-up direction, and their range is contracted to one half. On the other hand, the branch metric values are expanded to double thereof, and their effective bits are increased by one bit. In this state, subsequent ACS processes are executed. When a down signal is fed out again, the path metric values are further shifted by one bit, and their range is further contracted to one half, while the effective bits of the branch metric values are further increased by one bit.

After the subtraction shift, the path and branch metric values are fed from the detector 202 are fed to the ACS circuit 203, and the ACS circuit 203 adds the inputted path and branch metric values, and each state is compared between new path metric values derived from paths in preceding two states which undergo transition one after another.

The new path metric value that is selected as the maximum path as a result of the comparison, is fed out as a new path metric value in this state to the path metric memory 203. The selected signal, i.e., the result of comparison, is also fed out to the path memory (not shown).

The up (or down) signal and the shift constant S that are fed out from the detector 204 are held during the ACS process for one decoded data bit.

The construction and operation of the error correction circuit according to the present invention will now be described in connection with the case when the circuit is applied to a Viterbi coder with a restriction length of 7 and a coding factor of ½. In this case, the branch metric value computing circuit 201 executes branch metric computation from 7-bit received data, and feeds out 8-bit branch metric computation value. The detector 202 subtracts the previous minimum path metric value from the preceding path metric value. Also, receiving a range shift-up (or -down) signal and the shift constant S, the circuit 202 executes range shift-up (or -down) of the path and branch metric values, which the previous minimum path metric value was subtracted with.

ACS circuits 203 adds the preceding path metric value and the branch, compares the respective added values, selects the maximum path metric and feed out the selected new path metric (12 bits) and one bit path selection signal to the path memory.

The detector 204 detects the maximum and minimum path metric values in one-bit ACS process, and executes a range shift-up (or -down) judgment. The circuit 204 thus feeds out a range shift-up (or -down) signal and the minimum path metric value to the subtracting circuit with range shift 202. A 12-bit path metric value that is computed in the circuit 203 is held in the path metric memory 205.

In operation, when the received data is inputted as judgment 7-bit data, the branch metric value computing circuit 201 feeds out an 8-bit branch metric value according to a polynomial formula. It is assumed that the path metric value is provided by a 12-bit data. The branch metric value computed in the branch metric computing circuit 201, is fed together with the preceding path metric value to the subtracting circuit with range shift 202. In every ACS process, the subtracting circuit with range shift 202 computes (preceding path metric value−previous minimum path metric value).

The circuit 202 further ranges up (or down) the path metric values according to the up (or down) signal from the detector 204, and shifts the branch metric values according to the shift constant S. Thus, the new path metric values computed in the ACS circuit 203 are ranged up or down.

Figure 5:
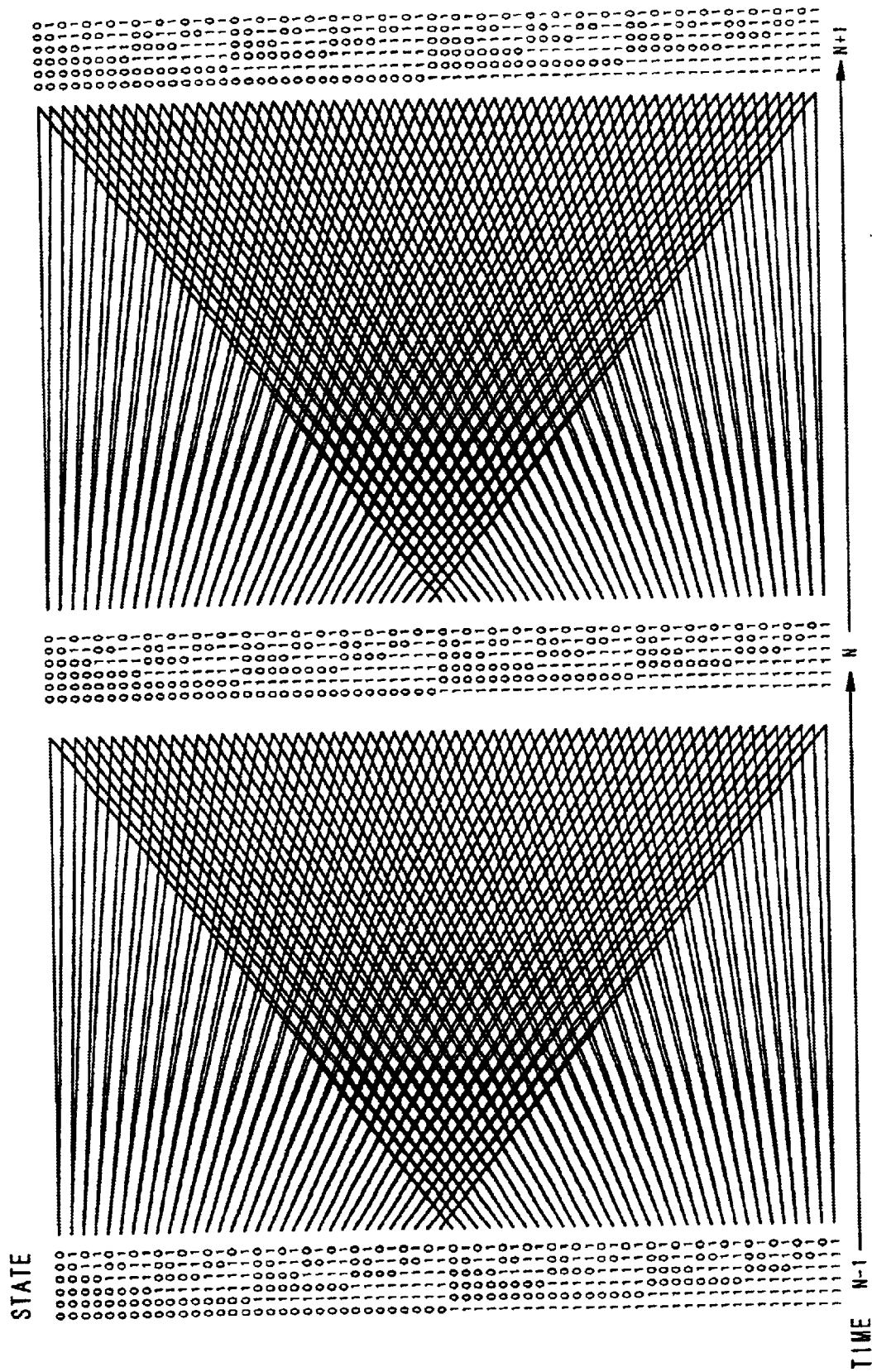
FIG. 5 is a diagram showing the processes in the Trellis diagram.

The range shift-up and -down operations are as described before, and are no longer described. The subtracting circuit with range shift 202 feeds out the subtraction shifted path and branch metric values to the ACS circuit 203 for the adding, comparing and selecting processes as described before. These processes are executed as shown in the Trellis diagram of FIG. 5.

The up (or down) signal and the shift constant S fed out from the detector 204 are held in an ACS process for one decoded data bit, i.e., an ACS process for a total of 64 states.

While the above embodiment has concerned with time-division basis ACS by one ACS, this specific example is of course by no means limitative. Likewise, in a Viterbi decoder based on parallel processing, the same process can be executed by providing a subtracting circuit with range shift and a detector.

Figure 6:
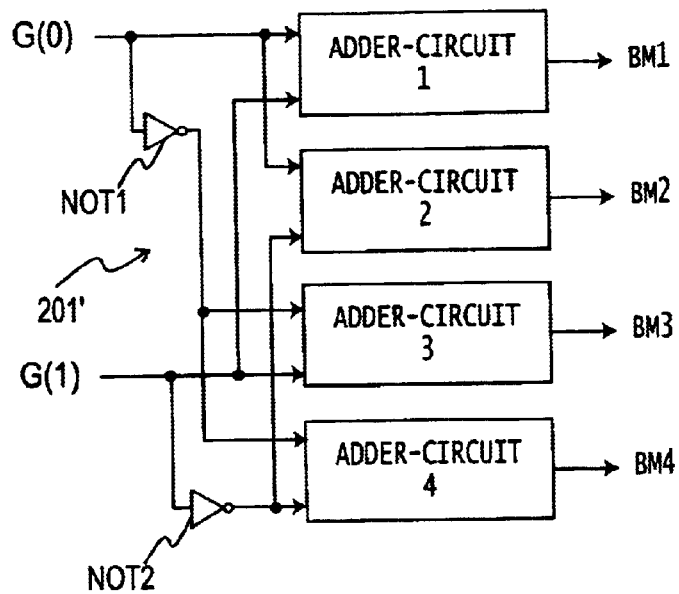
FIGS. 6 and 7 are block diagrams showing a branch metric value computing circuit 201, and an ACS circuit 203' in a 4-path parallel processing.
Figure 7:
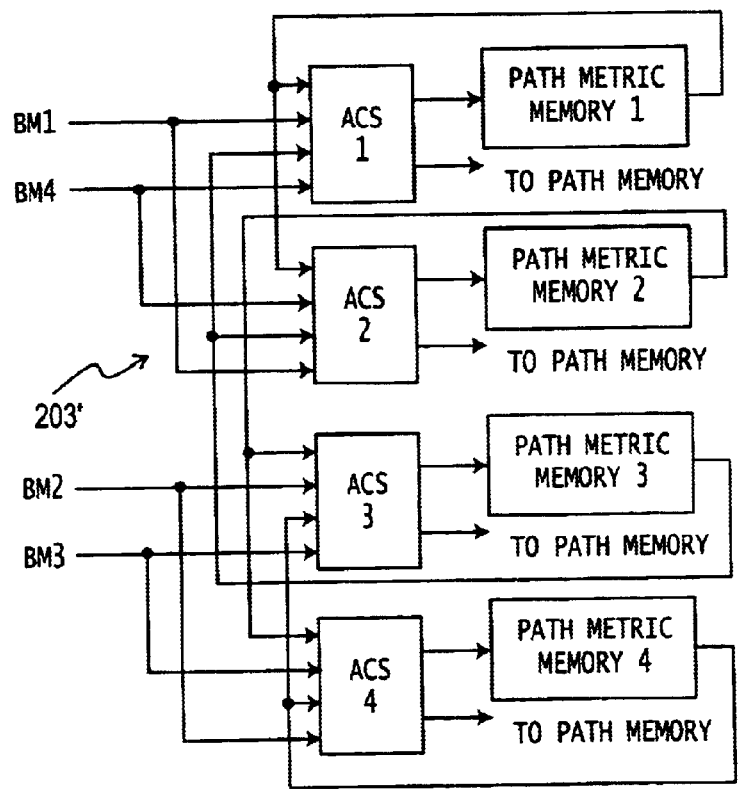
Figure 8:
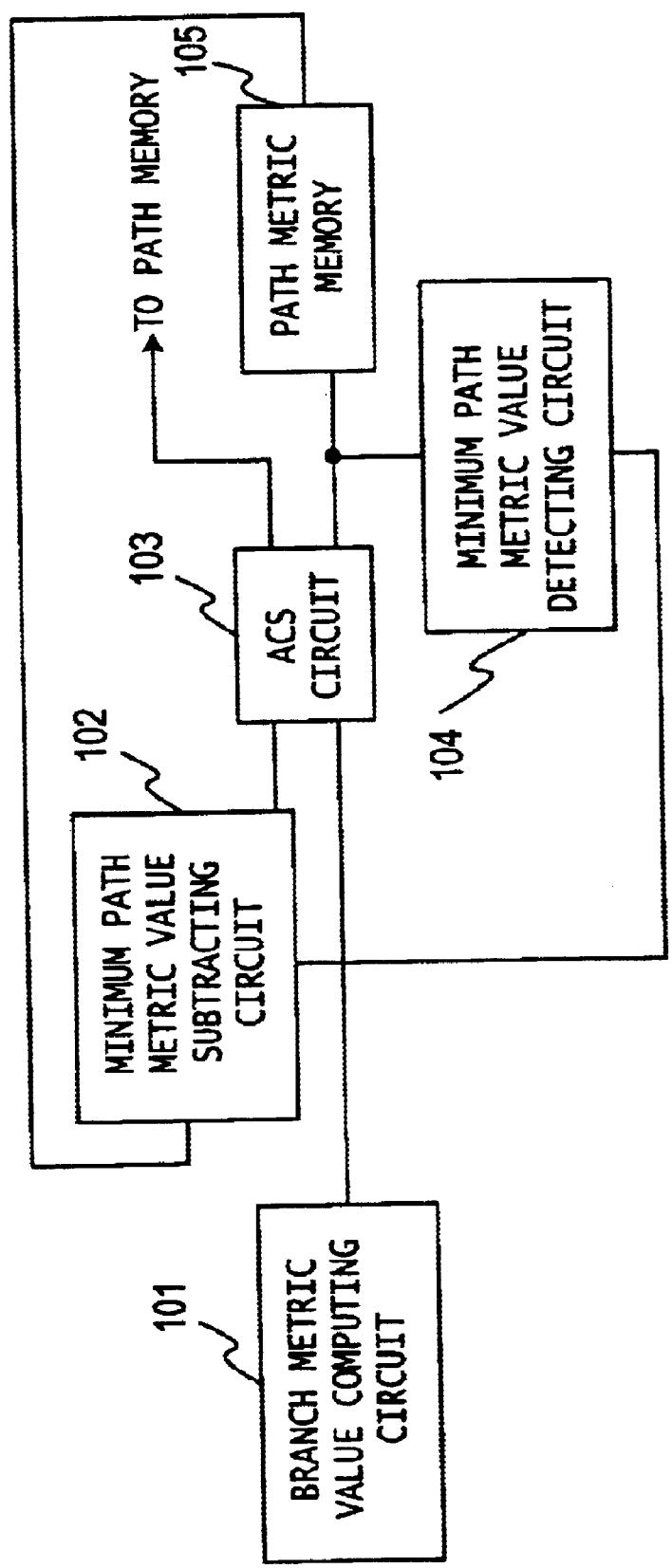
FIG. 8 is a block diagram showing a prior art error correction circuit.

The block diagram in the case of the parallel processing is basically the same as the block diagram shown in FIG. 1. FIGS. 6 and 7 are block diagrams showing a branch metric value computing circuit 201' and an ACS circuit 203' in a 4-path parallel processing. As is seen from these Figures, in this case four circuits having the same construction are provided in parallel arrangement for the 4-path parallel processing.

The branch metric value computing circuit 201' has four adders 1 to 4. Preceding state data G(0) is fed directly to the adders 1 and 2, and is fed via a NOT circuit (or inverter) NOT 1 to the adders 3 and 4. Also, previous state data G(1) is fed directly to the adders 1 and 3, and is fed via a NOT circuit NOT 2 to the adders 2 and 4. The adders 1 to 4 feed out branch metric values BM1 to BM4, respectively. The ACS circuit 203' has four ACS sub-circuits 1 to 4.

The branch metric values BM1 and BM4 are fed to the ACS sub-circuits 1 to 2, respectively, and the other branch metric values BM12 and BM3 are fed to the ACS sub-circuits 3 and 4, respectively. The ACS sub-circuits 1 to 4 feed out the computed path metric values to pair path memories and also to path metric memories 1 to 4.

The output of the path metric memory 1 is fed back to the ACS sub-circuits 1 and 2, the output of the path metric memory 2 is fed back to the ACS sub-circuits 3 and 4, the output of the path metric memory 3 is fed back to the ACS sub-circuits 1 and 2, and the output of the path metric memory 4 is fed back to the ACS sub-circuits 3 and 4.

As has been described in the foregoing, the error correction circuit and method according to the present invention functions such that, when an over-flow occurs, it expands the dynamic range and relatively shifts down the effective bits of the branch metric computation values, while in the absence of any over-flow it contracts the dynamic range and effectively shifts up the effective bits. The memory bits thus can be used effectively irrespective of whether C/N is good or bad. It is thus possible to dispense with a memory portion, which heretofore has not been substantially used. It is also possible to obtain a practically pronounced effect that it is possible to ensure high accuracy coding compared to the prior art in the case of mounting a memory of the same capacity.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. An error correction circuit based on a Viterbi decoding system comprising a branch metric computing circuit, an ACS circuit and a path metric memory, wherein:

the error correction circuit comprises a subtracting circuit with up-/down range shift disposed between the branch metric computing circuit and the ACS circuit;

the output of the ACS circuit being fed out via a detector to the subtracting circuit with up-/down range shift, wherein said up-/down range shift contracts an input path metric data to one half for a shift-down and expands said input data to double thereof for a shift-up.

2. The error correction circuit according to claim 1, wherein the subtracting circuit with up-/down range shift includes a subtracting circuit of a minimum path metric value from a path metric value and a first and a second range shifters.

3. The error correction circuit according to claim 2, wherein the branch metric computing circuit includes a plurality of adders, and the ACS circuit includes ACS sub-circuits corresponding to the adders, respectively, whereby a parallel processing of a plurality of paths is executed.

4. The error correction circuit according to one of claim 1, wherein the branch metric computing circuit includes a plurality of adders, and the ACS circuit includes ACS sub-circuits corresponding to the adders, respectively, whereby a parallel processing of a plurality of paths is executed.

5. The error correction circuit according to claim 1, wherein said subtracting circuit with up-/down range shift includes means for executing a comparison, from maximum and minimum values of all the new path metric values, as to whether it is necessary to up-/down shift the ranges in the next ACS process and holding the result of the comparison during the next ACS process.

6. The error correction circuit according to claim 5, wherein the subtracting circuit with up-/down range shift includes a subtracting circuit of a minimum path metric value from a path metric value and a first and a second range shifters.

7. The error correction circuit according to claim 6, wherein the branch metric computing circuit includes a plurality of adders, and the ACS circuit includes ACS sub-circuits corresponding to the adders, respectively, whereby a parallel processing of a plurality of paths is executed.

8. An error correction circuit based on a Viterbi decoding system comprising a branch metric computing circuit, an ACS circuit and a path metric memory, wherein:

the error correction circuit comprises a subtracting circuit with up-/down range shift disposed between the branch metric computing circuit and the ACS circuit;

the output of the ACS circuit being fed out via a detector to the subtracting circuit with up-/down range shift, and wherein the detector includes a maximum/minimum path metric value detecting circuit having a maximum and a minimum path metric value register, a range comparing circuit, a shift signal register and a reversible counter, wherein said up-/down range shift contracts an input path metric data to one half for a shift-down and expands said input data to double thereof for a shift-up.

9. The error correction circuit according to claim 8, wherein the branch metric computing circuit includes a plurality of adders, and the ACS circuit includes ACS sub-circuits corresponding to the adders, respectively, whereby a parallel processing of a plurality of paths is executed.

10. The error correction circuit according to claim 8, wherein the subtracting circuit with up-/down range shift includes a subtracting circuit of a minimum path metric value from a path metric value and a first and a second range shifters.

11. The error correction circuit according to claim 10, wherein the branch metric computing circuit includes a plurality of adders, and the ACS circuit includes ACS sub-circuits corresponding to the adders, respectively, whereby a parallel processing of a plurality of paths is executed.

12. An error correction circuit adopting a Viterbi decoding system, wherein preceding to a computing means for adding branch metric values and path metric values are provided a means for up-/down shifting the ranges of the branch and path metric values, and a means for executing a comparison, from maximum and minimum values of all the new path metric values, as to whether it is necessary to up-/down shift the ranges in the next ACS process and holding the result of the comparison during the next ACS process,
wherein said up-/down range shift contracts an input path metric data to one half for a shift-down and expands said input data to double thereof for a shift-up.

13. An error correction circuit comprising:
a branch metric value computing circuit for computing a branch metric value from received data;
a subtracting circuit with up/-down range shift for receiving a range shift signal, said subtracting circuit executing a range shift of path and branch metric value ranges, in which a minimum path metric range has been subtracted, and for subtracting a previously detected minimum path metric value from an immediately preceding path metric value;
an ACS circuit for executing addition and comparison of the preceding path metric values and branch metric values, and selecting the maximum path metric value to provide the selected new path metric value and a path selection signal;
a detector for detecting maximum and minimum path metric values in an ACS process for one-bit data, and also for detecting the range shift value to provide a range shift signal to the subtracting circuit with up/-down range shift; and
a path metric memory for holding the computed path metric values,
wherein said up-/down range shift contracts an input path metric data to one half for a shift-down and expands said input data to double thereof for a shift-up.

14. The error correction circuit according to claim 13, wherein the subtracting circuit with up-/down range shift includes
a subtracting circuit for subtracting a preceding minimum path metric value from a preceding path metric value;
an up-/down range shifter for contracting the input data to one half in response to the reception of a down signal while expanding the input data to double thereof in response to the reception of an up signal to feed out the resultant data to the ACS circuit; and
an up-/down range shifter for multiplying the branch metric value by 2S or (½)S, where S is a shift constant, and feeding out the resultant product value to the ACS circuit.

15. An error correction circuit comprising:
a branch metric value computing circuit for computing a branch metric value from received data;
a subtracting circuit with up-/down range shift for receiving a range shift signal, said subtracting circuit executing a range shift of path and branch metric value ranges, in which a minimum path metric range has been subtracted, and for subtracting a previously detected minimum path metric value from an immediately preceding path metric value;
an ACS circuit for executing addition and comparison of the preceding path metric values and branch metric values, and selecting the maximum path metric value to provide the selected new path metric value and a path selection signal;
a detector for detecting maximum and minimum path metric values in an ACS process for one-bit data, and also for detecting the range shift value to provide a range shift signal to the subtracting circuit with up-/down range shift; and
a path metric memory for holding the computed path metric values,
wherein the detector includes:
a maximum/minimum path metric value detecting circuit for detecting the maximum and minimum path metric values among new path metric values which have been obtained in an ACS process for one bit of decoded data,
a range comparing circuit for generating a range shift-up signal when ((previous maximum path metric value−previous minimum path metric value)+maximum branch metric value) becomes greater than the maximum value that can be stored in the memory, and a range shift-down signal when ((previous maximum path metric value−previous minimum path metric value)×2+maximum branch metric value) becomes less than the maximum value that can be stored in the memory;
a shift signal register for latching the shift-up or shift-down signal, and holding the latched signal during the next process for one decoded data bit when the ACS process for one decoded data is ended; and
a reversible counter for detecting the shift-up or shift-down signal, and executing one count-up (+1) or -down (−1), and during a next ACS process for one decoded data bit when the ACS process for one decoded data bit is ended.

16. An error correction method comprising steps of:
computing a branch metric value from received data;
receiving a range shift-up (or -down) signal, and executing range shift-up (or -down) of the path and branch metric value ranges, in which a minimum path metric range has been subtracted, for subtracting a previously detected minimum path metric value from an immediately preceding path metric value;
executing addition and comparison of preceding path metric values and branch metric values, and selecting a maximum path metric value to provide the selected new path metric value and a path selection signal;
detecting maximum and minimum path metric values in an ACS process for one-bit data, and also executing range shift-up (or -down) judgment to provide a range shift-up (-down) signal and a minimum path metric value to a subtracting circuit with up/-down range shift; and
holding the computed path metric values,
wherein said up/-down range shift contracts an input path metric data to one half for a shift-down and expands said input data to double thereof for a shift-up.

* * * * *